(12) United States Patent
Nagakura

(10) Patent No.: US 7,191,102 B2
(45) Date of Patent: Mar. 13, 2007

(54) COMPUTER-READABLE RECORDING MEDIUM RECORDED WITH NUMERICAL ANALYSIS PROGRAM, NUMERICAL ANALYSIS SYSTEM, AND NUMERICAL ANALYSIS METHOD

(75) Inventor: Masahiro Nagakura, Shizuoka (JP)

(73) Assignee: Fujitsu Limited, Kawasaki (JP)

( * ) Notice: Subject to any disclaimer, the term of this patent is extended or adjusted under 35 U.S.C. 154(b) by 689 days.

(21) Appl. No.: 09/785,208

(22) Filed: Feb. 20, 2001

(65) Prior Publication Data

US 2002/0032547 A1 Mar. 14, 2002

(30) Foreign Application Priority Data

Sep. 13, 2000 (JP) .............................. 2000-278734

(51) Int. Cl.
*G06F 17/10* (2006.01)
*G06F 19/00* (2006.01)
*G06F 7/48* (2006.01)

(52) U.S. Cl. ............................................. 703/2; 700/97
(58) Field of Classification Search .................... 703/2; 700/97

See application file for complete search history.

(56) References Cited

U.S. PATENT DOCUMENTS

| 3,597,744 | A | * | 8/1971 | Case et al. .................... 712/11 |
| 5,442,569 | A | * | 8/1995 | Osano .......................... 716/20 |
| 5,453,934 | A | * | 9/1995 | Taghavi et al. ............. 700/182 |
| 5,552,995 | A | * | 9/1996 | Sebastian ..................... 700/97 |
| 5,616,866 | A | * | 4/1997 | Murakami .................... 73/804 |
| 5,923,565 | A | * | 7/1999 | Smith et al. .................... 703/4 |
| 6,430,455 | B1 | * | 8/2002 | Rebello et al. ............. 700/105 |
| 6,434,441 | B1 | * | 8/2002 | Beauchamp et al. .......... 700/98 |

OTHER PUBLICATIONS

Minoru et al., Nuclear Power Piping 3-D CAD System: IMPULS Ishikawajima-Harima Heavy Industries 1996. p. 404-409.*
Rui et al., "A Review of ANN-based Short-Term Load Forecasting" p. 78-82. 1995. IEEE.*

* cited by examiner

*Primary Examiner*—Anthony Knight
*Assistant Examiner*—Thomas Stevens
(74) *Attorney, Agent, or Firm*—Staas & Halsey LLP

(57) ABSTRACT

A computer-readable recording medium recorded with a numerical analysis program, a numerical analysis system, and a numerical analysis method, where creation and modification of an analytic model is simplified by applying load region data for specifying a load applying region, to a master model representing a shape of an object.

12 Claims, 5 Drawing Sheets

FIG.2A

| ATTRIBUTE VALUE (EXTERNAL FORCE) | MEANING |
|---|---|
| LOAD TYPE<br>LOAD VALUE<br>DIRECTION VECTOR<br>COMMENT CHARACTER STRING | 0:PER UNIT AREA, 1:TOTAL LOAD VALUE<br>LOAD VALUE<br>LOAD DIRECTION<br>OPTIONAL COMMENT CHARACTER STRING |

FIG.2B

| ATTRIBUTE VALUE (TEMPERATURE) | MEANING |
|---|---|
| TEMPERATURE<br>COMMENT CHARACTER STRING | LOAD VALUE(TEMPERATURE)<br>OPTIONAL COMMENT CHARACTER STRING |

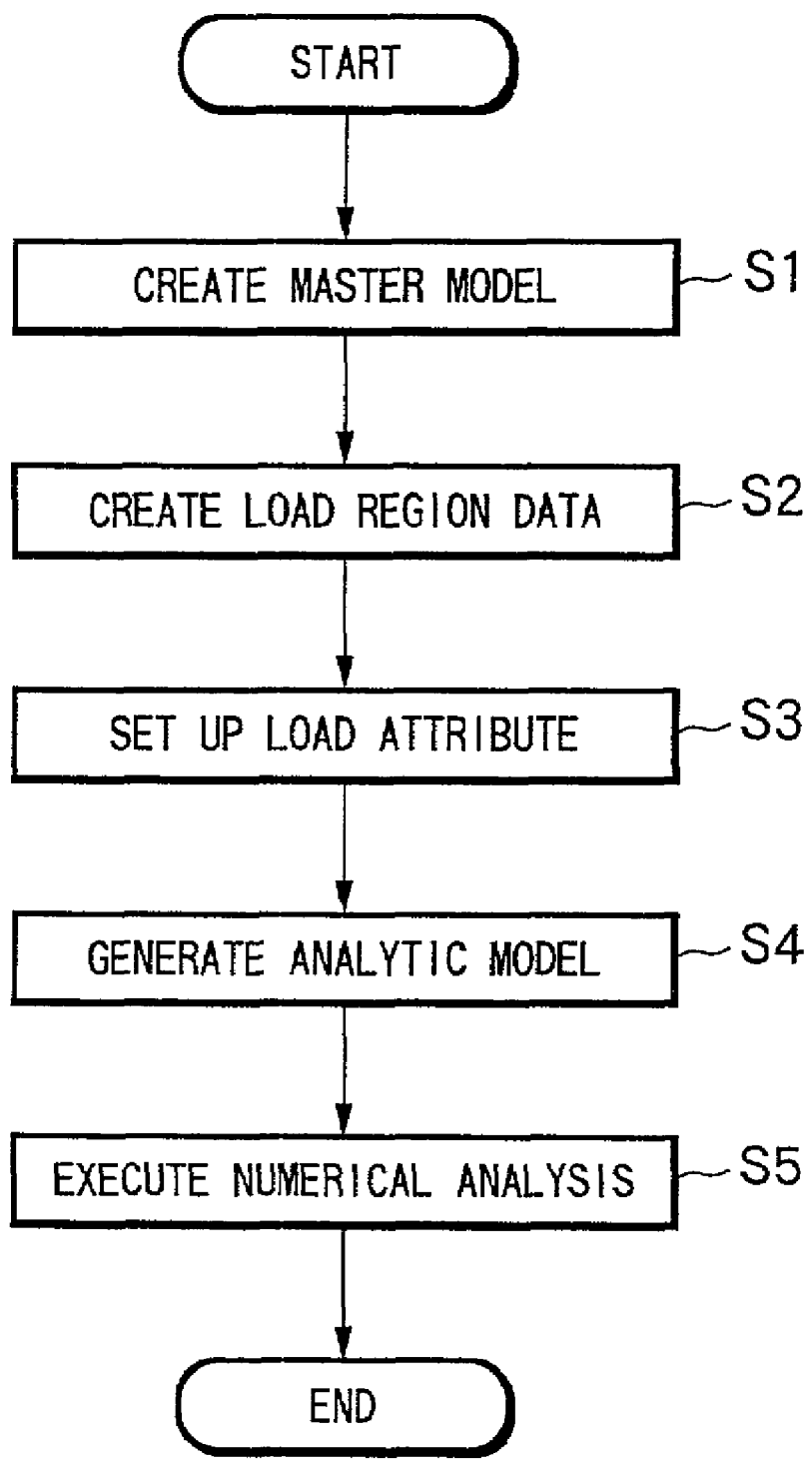

COMPUTER-READABLE RECORDING MEDIUM RECORDED WITH NUMERICAL ANALYSIS PROGRAM, NUMERICAL ANALYSIS SYSTEM, AND NUMERICAL ANALYSIS METHOD

FIELD OF THE INVENTION

The present invention relates to techniques for computer-aided numerical analysis, particularly for simplifying creation and modification of an analytic model.

RELATED ART OF THE INVENTION

Up to now, as numerical analysis methods for numerically analyzing problems in the fields of science and engineering, there is known for example the finite difference method (FDM), the finite element method (FEM) and the boundary element method (BEM).

In computer-aided numerical analysis, for a master model created using for example CAD (Computer Aided Design), it is necessary to create an analytic model set up with a region for applying a load (hereunder referred to as a load applying region). The analytic model is created by directly adding to the master model, a ridge line demarcating the load applying region. From the point of operability, the creation of such an analytic model is normally best done by CAD rather than by numerical analysis software, and therefore is mostly performed by CAD as a part of plain shape editing. And, the load attribute for the load applying region is set up by numerical analysis software, and numerical analysis such as structural analysis, thermal conduction simulation and the like is executed.

However, when a master model is directly edited solely for the numerical analysis, a master model with finish symbols and the like appended is modified, with the problem that handling with respect to the master model becomes difficult. Furthermore, in modifying the load applying region, the master model must be re-edited on CAD. Hence modification of the analytic model is not so simple.

In order to solve such a problem, it has also been considered to use a copy model which is a copy of the master model. However, in this case, since coordinated control of the master model and the copy model is necessary, problems arising from the likelihood of operation difficulties are pointed out.

The present invention takes into consideration the above heretofore problems, with the object of providing a numerical analysis technique where, by jointly using load region data in which a load applying region has been set up, separate from a master model, creation and modification of the analytic model is simplified.

SUMMARY OF THE INVENTION

For this purpose, with a numerical analysis technique according to the present invention, a master model representing a shape of an object is created, and load region data for specifying a load applying region in the master model is created, and an analytic model where the load region data is added to the master model is generated.

With such a construction, the analytic model is generated by logically adding different load region data to the master model, without accompanying the edition of the master model at all. Therefore, handling of the master model is simplified, and the analytic model can be easily created. Moreover, in the case where the load applying region is modified, only the load applying region data need be re-edited. Hence modification of the analytic model can be easily performed.

Here, a load attribute may be set up for the load applying region specified by the load region data, and an analytic model with the load attribute added generated.

With such a construction, the analytic model with the load region data and the load attribute added is generated for the master model. Therefore, at the time of executing numerical analysis, there is no requirement as with the conventional technique for setting up the load attribute in the load adding region, enabling simplification of the operation in the case of numerical analysis.

Moreover, the load applying region may be set up by projecting an optional shape surface onto the master model. In this case, the projection direction of the optional shape surface with respect to the master model is preferably designated by a vector.

With such a construction, the load applying region is set up by projecting an optional shape surface onto the master model. Therefore, in the case where the master model comprises a complex shape, there is no requirement to set up a complex load applying region copied to the external shape, enabling a reduction in the labor and working hours required for load region data creation. Moreover, if the projection direction of the optional shape surface with respect to the master model is designated by a vector, then by merely changing the vector specifying the projection direction, the load applying region can be modified, enabling an improvement in operability. In this case, a multitude of operation techniques may also be offered to a user.

Other objects and aspects of the present invention will become apparent from the following description of embodiments given in conjunction with the appended drawings.

BRIEF EXPLANATION OF THE DRAWINGS

FIG. 2 shows an example of a load attribute, (A) being an explanatory diagram of an attribute for when a load is an external force, and (B) being an explanatory diagram of an attribute for when a load is temperature.

FIG. 3 is a flow chart for explaining the flow of a numerical analysis process.

PREFERRED EMBODIMENT

Hereunder is a detailed description of the present invention with reference to the appended drawings.

Figure 1:
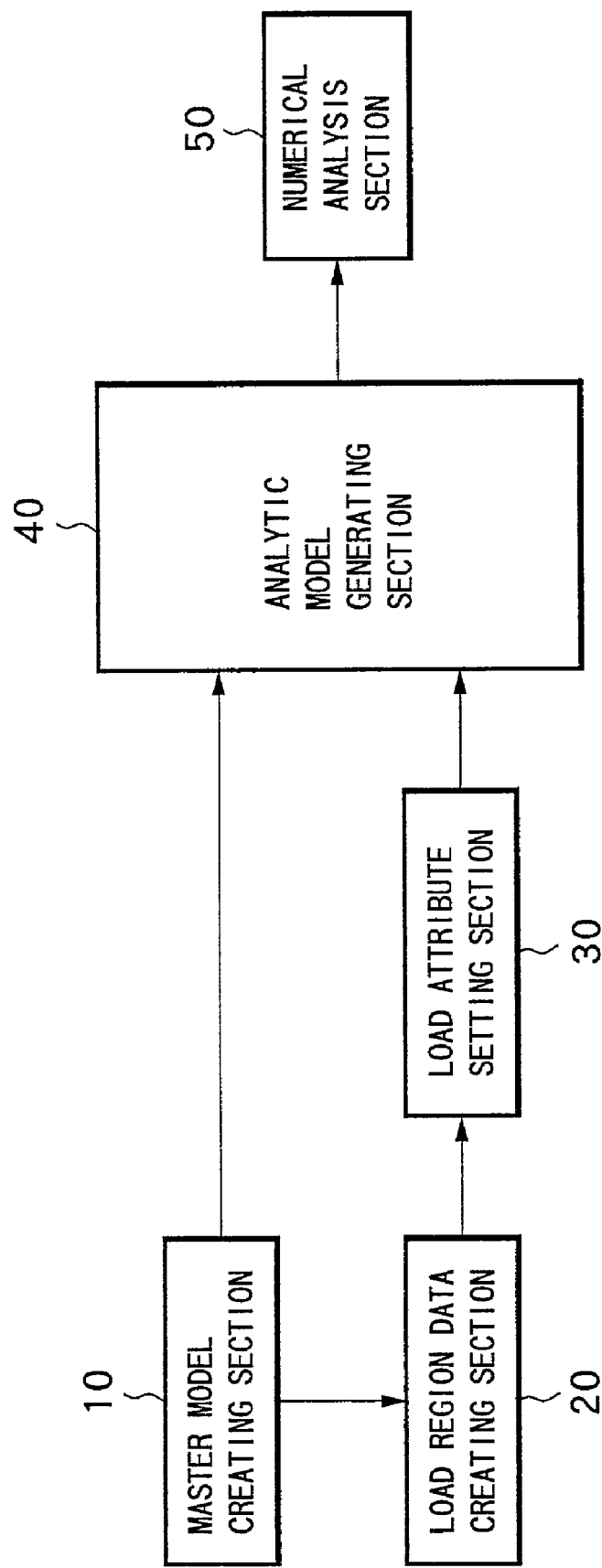
FIG. 1 is a functional block diagram of a numerical analysis system according to the present invention.

FIG. 1 shows a functional block diagram of a numerical analysis system according to the present invention. The numerical analysis system is constructed with a computer incorporating at least a central processing unit (CPU) and a memory, and the system is realized as software by a program loaded into the memory.

The numerical analysis system comprises a master model creating section 10, a load region data creating section 20, a load attribute setting section 30, an analytic model generating section 40, and a numerical analysis section 50.

In the master model creating section 10 is created three-dimensional CAD data (master model) representing the shape of an object, being the numerical analysis target. That is to say, the master model creating section 10 has a function as a common three-dimensional CAD, and creates at least shape data for the object being the numerical analysis target, in response to input operations of a user. Here the master model creating section 10 acts as a master model creating function, master model creating means and a master model creating step.

In the load region data creating section 20 is created load region data which specifies the load applying region in the master model. That is, in the performing numerical analysis related to the object, it is necessary to set up a region to be applied with the external load (external force, temperature, etc.). As used hereafter, the term load refers to an external force or a temperature. Therefore load region data for specifying the load applying region is created. Here the load region data is created as logically different data to the master model. The load region data creating section 20 acts as a load region data creating function, load region data creating means and a load region data creating step.

In the load attribute setting section 30 is set up a load attribute which describes which external load is to be applied to the load applying region specified by the load region data. The load attribute, as shown in FIG. 2, in the case where the external load is an external force, means the load type, the load value, the direction vector, the comment character string and the like, while in the case where the external load is temperature, means the temperature, comment character string and the like. Here, it is necessary to make the load attribute one enabling to be recognized by a later described numerical analysis section 50. The load attribute setting section 30 acts as a load attribute setting function, load attribute setting means and a load attribute setting step.

In the analytic model generating section 40, the load region data and the load attribute are added to the master model created by the master model creating section 10, to generate an analytic model for input to the numerical analysis section 50. The analytic model generating section 40 acts as an analytic model generating function, analytic model generating means and an analytic model generating step.

In the numerical analysis section 50, numerical analysis such as structural analysis or thermal conduction simulation for the input analytic model is executed by numerical analysis techniques such as the finite difference method (FDM), the finite element method (FEM), or the boundary element method (BEM). The numerical analysis results are displayed on a display device such as a CRT (cathode ray tube), an LCD (liquid crystal display) or the like (not shown in the figure).

Next is a description of the operation of the numerical analysis system comprising such a construction, with reference to the flow chart of FIG. 3.

Figure 4A:
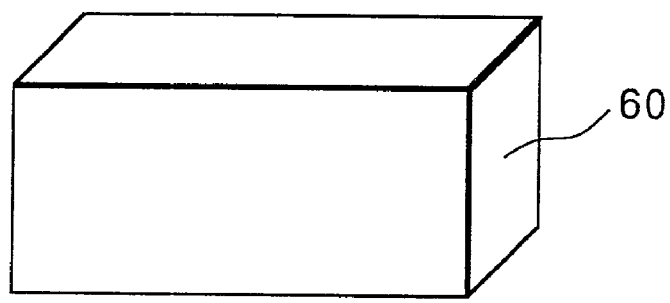
FIG. 4 shows creation steps for an analytic model, (A) being an explanatory diagram for a master model, (B) being an explanatory diagram for a load applying region, and (C) being an explanatory diagram for an analytic model.

In step 1 (abbreviated to "S1" in the figure and similarly for other steps), a master model 60 as shown in FIG. 4(A) is created by a CAD function provided from the master model creating section 10. Here, taking into consideration of the case where for example the master model has already been created in a design stage, an existing master model may be read in. The process in step 1 corresponds to the master model creating function, the master model creating means and the master model creating step.

Figure 4B:
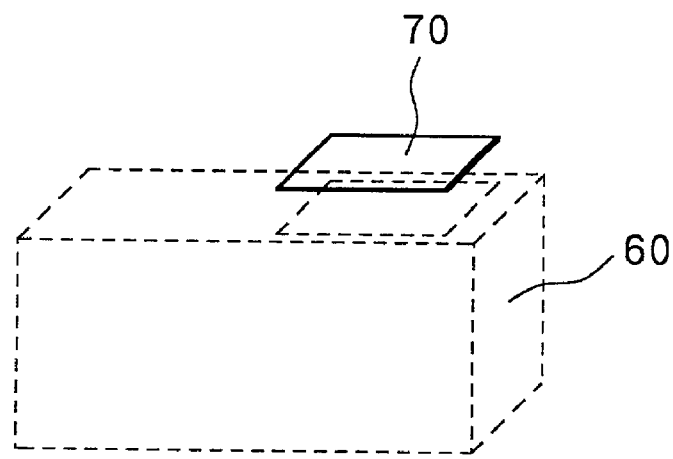

In step 2, load region data for specifying a load applying region 70 in the master model 60 as shown in FIG. 4(B) is created by a function provided from the load region data creating section 20. The load applying region 70 is the region which specifies on which portion of the master model 60 the load will be applied, and is represented by a surface or line copied to the external shape of the master model 60. Here the load applying region 70, in view of the operability thereof, is preferably to be able to be set up by a function similar to a CAD function. The process in step 2 corresponds to the load region data creating function, the load region data creating means, and load region data creating step.

In step 3, by a function provided from the load attribute setting section 30, an attribute which describes which external load is to be applied to the load applying region 70 specified by the load region data is set up. Here the load attribute, as with the conventional technique, may be able to be set up by the function provided from the numerical analysis section 50 being the numerical analysis software. The processing in step 3 corresponds to the load attribute setting function, the load attribute setting means, and load attribute setting step.

Figure 4C:
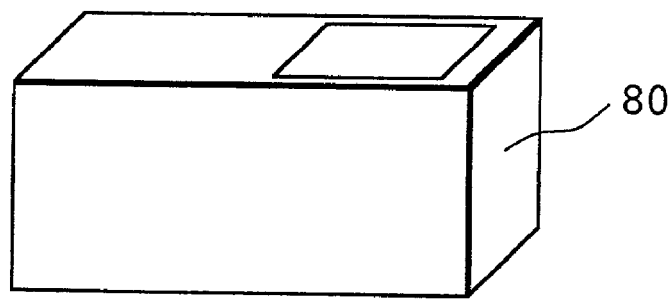

In step 4, by a function provided from the analytic model generating section 40, the load region data and the load attribute are added to the master model 60, to generate an analytic model 80 such as shown in FIG. 4(C). Here in the case where the load attribute is not set up in step 3, an analytic model 80 where only the load region data is added to the master model 60 is generated. The process of step 4 corresponds to the analytic model generating function, the analytic model generating means and the analytic model generating step.

In step 5, by a function provided from the numerical analysis section 50, numerical analysis such as structural analysis, thermal conduction simulation and the like is executed based on the analytic model 80. Here in the case where the load attribute is not set up in the analytic model 80, the load attribute must be set up in the numerical analysis section 50 as with the conventional technique.

According to the process of step 1 through step 5 described above, the analytic model 80 is generated by adding the logically different load region data to the master model 60. That is to say, the analytic model 80 is generated without accompanying the edition of the master model 60 at all. Therefore, handling of the master model 60 becomes simple, and the analytic model 80 can be easily created. Moreover, in the case of modifying the load applying region 70, since only the load region data need be re-edited, modification of the analytic model 80 becomes simple.

Furthermore, if the load attribute is set up in the load attribute setting section 30, the load region data and the load attribute are added to the master model 60, and the analytic model 80 is generated. Therefore, there is no longer the need to set up the load attribute in the numerical analysis section 50, so that the operation in the numerical analysis section 50, being the numerical analysis software, is simplified.

Figure 5:
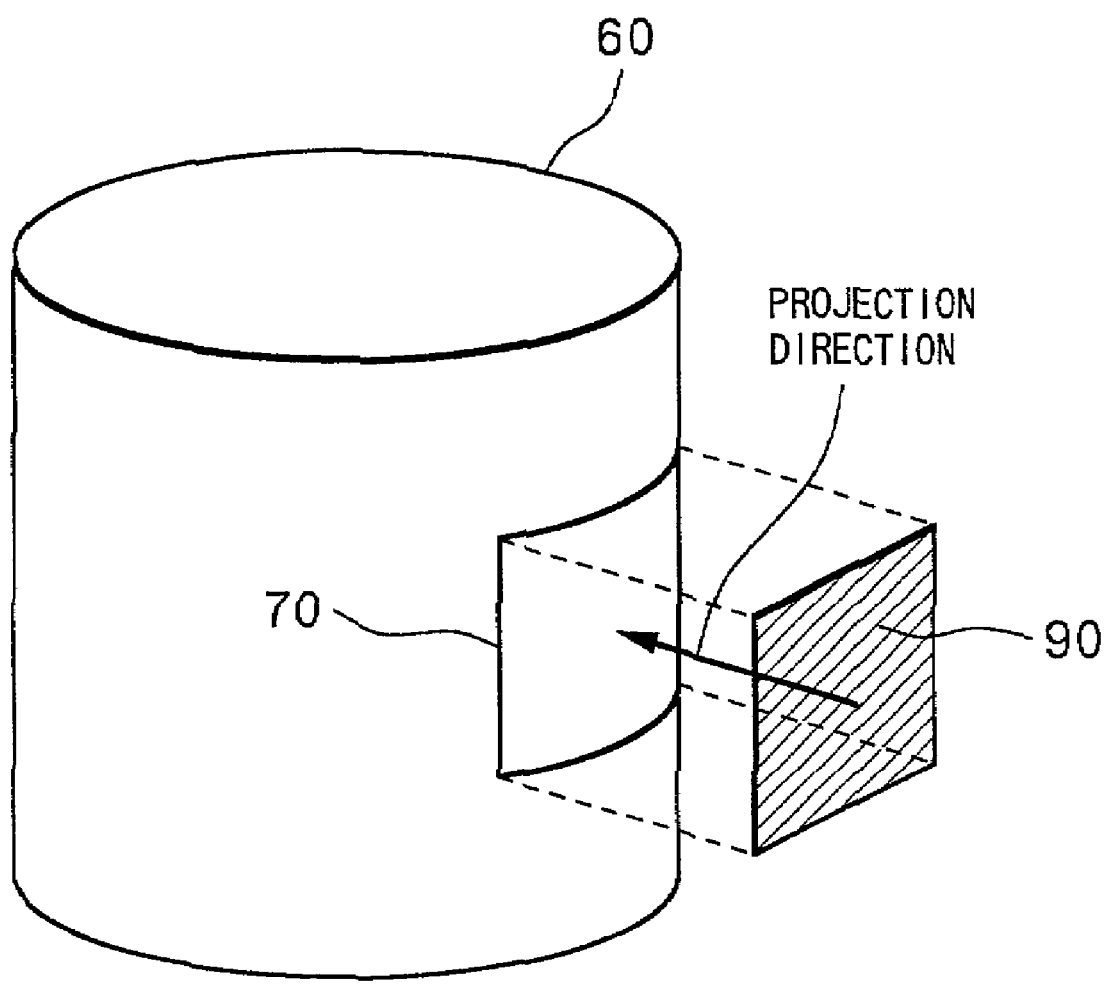
FIG. 5 is an explanatory diagram for a technique for projecting an optional shape surface onto a master model, and setting up a load applying region.

Incidentally, in the load region data creating section 20, as shown in FIG. 5, the load applying region 70 can be set up by projecting an optional shape surface 90 onto the master model 60. If this is done, then in the case where the master model 60 comprises a complex shape, there is no requirement to set up a complex load applying region 70 copies to the external shape, enabling a reduction in the labor and working hours required for load region data creation. Here preferably the projection direction of the optional shape surface 90 towards the master model 60 is preferable to be designated by a vector. In this case, by merely changing the vector specifying the projection direction, the load applying region 70 for the master model 60 comprising a complex shape can be modified, enabling an improvement in operability. Moreover, a multitude of operation techniques may also be offered to a user.

The numerical analysis system may also comprise; three-dimensional CAD having in combination the function of the master model creating section 10, the load region data creating section 20, the load attribute setting section 30 and the analytic model generating section 40, and numerical analysis software having the function of the numerical analysis section 50. In this case, in consideration of the fact that the load attribute is not always set up on three-dimensional CAD, then preferably a function for setting up the load attribute is provided in the numerical analysis software. Furthermore, the analytic model generating section 40 may be provided in the numerical analysis software.

If a program for realizing such functions is recorded for example on a computer-readable recording medium such as a magnetic tape, a magnetic disc, a magnetic drum, an IC card, a CD-ROM, a DVD-ROM or the like, then the numerical analysis program according to the present invention can be distributed in the market. Then, a person who acquires such a recording medium can easily construct the numerical analysis system according to the present invention, using a standard computer.

What is claimed is:

1. A computer-readable recording medium recorded with a numerical analysis program for realizing on a computer:
   a master model creating function for creating a master model representing a shape of an object,
   a load region data creating function for creating load region data for specifying a load applying region in said master model, the load applying region being a portion of the master model to which a load will be applied, the load being at least one of an external force and a temperature, and
   an analytic model generating function for generating an analytic model where the load region data created by said load region data creating function is added to the master model created by said master model creating function.

2. A computer-readable recording medium recorded with a numerical analysis program according to claim 1, wherein
   said numerical analysis program further comprises a load attribute setting function for setting up a load attribute for the load applying region specified by said load region data, and
   said analytic model generating function, when a load attribute has been set up by said load attribute setting function, generates an analytic model with the load attribute added.

3. A computer-readable recording medium recorded with a numerical analysis program according to claim 1, wherein said load region data creating function sets up the load applying region by projecting an optional shape surface onto the master model.

4. A computer-readable recording medium recorded with a numerical analysis program according to claim 3, wherein said load region data creating function designates a projection direction of the optional shape surface with respect to said master model by a vector.

5. A numerical analysis system comprising:
   master model creating means for creating a master model representing a shape of an object,
   load region data creating means for creating load region data for specifying a load applying region in said master model, the load applying region being a portion of the master model to which a load will be applied, the load being at least one of an external force and a temperature, and
   analytic model generating means for generating an analytic model where the load region data created by said load region data creating means is added to the master model created by said master model creating means.

6. A numerical analysis system according to claim 5, wherein
   said numerical analysis system further comprises load attribute setting means for setting up a load attribute for the load applying region specified by said load region data, and
   said analytic model generating means, when a load attribute has been set up by said load attribute setting means, generates an analytic model with the load attribute added.

7. A numerical analysis system according to claim 5, wherein said load region data creating means sets up the load applying region by projecting an optional shape surface onto the master model.

8. A numerical analysis system according to claim 7, wherein said load region data creating means designates a projection direction of the optional shape surface with respect to said master model by a vector.

9. A numerical analysis method comprising:
   a master model creating step for creating a master model representing a shape of an object,
   a load region data creating step for creating load region data for specifying a load applying region in said master model, the load applying region being a portion of the master model to which a load will be applied, the load being at least one of an external force and a temperature, and
   an analytic model generating step for generating an analytic model where the load region data created by said load region data creating step is added to the master model created by said master model creating step.

10. A numerical analysis method according to claim 9, wherein
    said numerical analysis method further comprises a load attribute setting step for setting up a load attribute for the load applying region specified by said load region data, and
    said analytic model generating step, when a load attribute has been set up by said load attribute setting step, generates an analytic model with the load attribute added.

11. A numerical analysis method according to claim 9, wherein said load region data creating step sets up the load applying region by projecting an optional shape surface onto the master model.

12. A numerical analysis method according to claim 11, wherein said load region data creating step designates a projection direction of the optional shape surface with respect to said master model by a vector.

* * * * *